(12) United States Patent
Leobandung

(10) Patent No.: US 9,324,710 B2
(45) Date of Patent: Apr. 26, 2016

(54) VERY PLANAR GATE CUT POST REPLACEMENT GATE PROCESS

(71) Applicant: International Business Machines Corporation, Armonk, NY (US)

(72) Inventor: Effendi Leobandung, Stormville, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 81 days.

(21) Appl. No.: 14/187,896

(22) Filed: Feb. 24, 2014

(65) Prior Publication Data
US 2015/0243651 A1    Aug. 27, 2015

(51) Int. Cl.
| | |
|---|---|
| H01L 29/40 | (2006.01) |
| H01L 27/088 | (2006.01) |
| H01L 29/66 | (2006.01) |
| H01L 29/51 | (2006.01) |
| H01L 29/49 | (2006.01) |
| H01L 21/84 | (2006.01) |
| H01L 27/12 | (2006.01) |
| H01L 21/8234 | (2006.01) |
| H01L 21/02 | (2006.01) |

(Continued)

(52) U.S. Cl.
CPC .......... *H01L 27/088* (2013.01); *H01L 21/0217* (2013.01); *H01L 21/02164* (2013.01); *H01L 21/31055* (2013.01); *H01L 21/3212* (2013.01); *H01L 21/823437* (2013.01); *H01L 21/823462* (2013.01); *H01L 21/84* (2013.01); *H01L 27/1203* (2013.01); *H01L 29/4966* (2013.01); *H01L 29/517* (2013.01); *H01L 29/518* (2013.01); *H01L 29/66545* (2013.01)

(58) Field of Classification Search
CPC .............. H01L 29/739; H01L 29/7722; H01L 29/1066; H01L 27/0225; H01L 27/098; H01L 29/402; H01L 29/7835; H01L 29/7802; H01L 29/407; H01L 29/66659
USPC ........................... 257/264, 340, 390; 438/587
See application file for complete search history.

(56) References Cited

U.S. PATENT DOCUMENTS

| | | |
|---|---|---|
| 5,451,801 A | 9/1995 | Anderson et al. |
| 5,459,340 A | 10/1995 | Anderson et al. |

(Continued)

FOREIGN PATENT DOCUMENTS

JP         2929944 B2      5/1999

*Primary Examiner* — Monica D Harrison
(74) *Attorney, Agent, or Firm* — Scully, Scott, Murphy & Presser, P.C.; Louis J. Percello, Esq.

(57) ABSTRACT

A semiconductor structure with improved gate planarity and method of fabrication are provided. In a replacement gate scheme, an array of sacrificial gate structures of substantially uniform pitch and spacing formed over a semiconductor substrate is removed and replaced with functional gate structures. Portions of functional gate structures that are accounted as extraneous features in a circuit design are subsequently removed and the removed portions of the functional gate structures are filled with a dielectric material. Because the functional gate structures of substantially uniform pitch and spacing are formed before removal of unwanted portions of the functional gate structures, the chemical mechanical polishing process can be accomplished uniformly across the semiconductor substrate. The functional gate structures thus formed have a substantially uniform height across the substrate.

20 Claims, 17 Drawing Sheets

(51) Int. Cl.
*H01L 21/3105* (2006.01)
*H01L 21/321* (2006.01)

(56) References Cited

U.S. PATENT DOCUMENTS

| | | | |
|---|---|---|---|
| 6,423,619 B1 | 7/2002 | Grant et al. | |
| 6,943,415 B2 | 9/2005 | Corrigan | |
| 7,071,086 B2 | 7/2006 | Woo et al. | |
| 7,632,745 B2 | 12/2009 | Chen | |
| 8,048,788 B2 | 11/2011 | Hautala et al. | |
| 8,334,184 B2 | 12/2012 | Steigerwald et al. | |
| 8,901,670 B2 * | 12/2014 | Kanakasabapathy et al. | 257/388 |

* cited by examiner

VERY PLANAR GATE CUT POST REPLACEMENT GATE PROCESS

BACKGROUND

The present disclosure relates to a semiconductor structure and a method of forming the same. More particularly, the present disclosure relates to a semiconductor structure with improved gate planarity and a method of forming the same.

In an effort to build integrated circuits with higher performance and increased yields, a number of process technologies have emerged. One such technology improvement is to use a sacrificial gate structure to improve the geometry, manufacturability and performance of a gate structure.

In a typical replacement metal gate process, also known as a gate-last process, a sacrificial gate material (e.g., polysilicon) is used for forming a self-aligned gate-to-source/drain structure. Subsequently, the sacrificial gate material is removed and replaced with a gate structure including desired gate dielectrics and gate electrode. In the gate-last process, gate height control is critical to proper transistor function since variation in gate height may lead to measurable transistor performance variability.

In the gate-last process, Chemical Mechanical Polishing (CMP) is used to expose the sacrificial gate structure for subsequent removal and it is also used to remove excess final gate fill metal after the replacement gate structure is finished. The CMP process requires extreme control over final gate height and topography. However, problems arise when integrating the gate-last process with CMP processes because it may be difficult to control a uniform gate height for devices in various regions of the substrate having different pattern densities during the CMP processes.

Therefore, there remains a need to provide a field effect transistor (FET) with improved gate planarity in a replacement metal gate process.

SUMMARY

The present disclosure provides a semiconductor structure with improved gate planarity and methods of fabrication. In a replacement gate scheme, an array of sacrificial gate structures of substantially uniform pitch and spacing formed over a semiconductor substrate is removed and replaced with functional gate structures. Portions of the functional gate structures that are accounted as extraneous features in a circuit design are subsequently removed and the removed portions of the functional gate structures are filled with a dielectric material. Because functional gate structures having substantially uniform pitch and spacing are formed before removal of unwanted portions of the functional gate structures, the chemical mechanical polishing process can be accomplished uniformly across the semiconductor substrate. The functional gate structures thus formed have a substantially uniform height across the substrate.

In one aspect of the present disclosure, a method of forming a semiconductor structure is provided. The method includes first forming an array of functional gate structures of substantially uniform pitch and spacing over a semiconductor substrate. The functional gate structures are of a substantially uniform height and are separated from each other by a first dielectric material layer portion. Portions of the functional gate structures are then removed according to a circuit design. Next, second dielectric material layer portions are formed in the removed portions of the functional gate structures.

In another aspect of the present disclosure, a semiconductor structure is provided. The semiconductor structure includes first dielectric material layer portions. The first dielectric material layer portions are arranged in a uniform array and extend in a first direction across a semiconductor substrate. A plurality of functional gate structures are disposed in portions of spaces between the first dielectric material layer portions. The functional gate structures have a substantially uniform height. Second dielectric material layer portions are disposed in remaining portions of spaces between the first dielectric material layer portions. In accordance with the present disclosure, the functional gate structures are separated from each other by the first dielectric material layer portions in the first direction, and portions of the functional gate structures are separated from each other by the second dielectric material layer portions in a second direction perpendicular to the first direction.

DETAILED DESCRIPTION

Figure 1A:
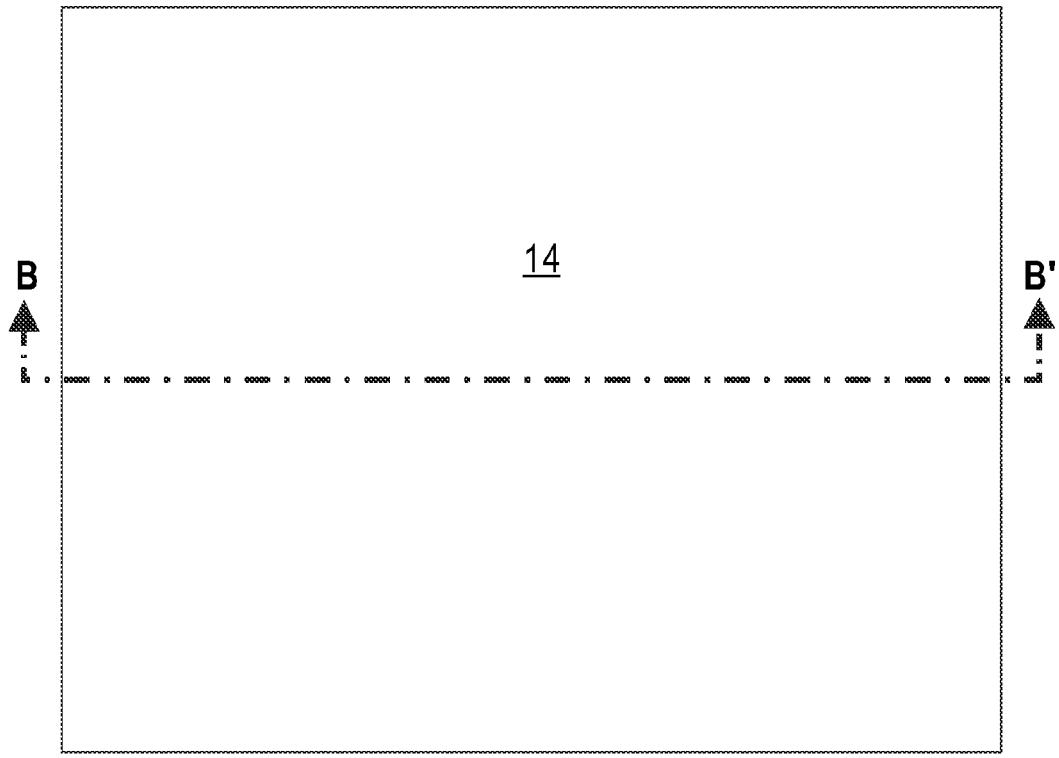
FIG. 1A is a top-down view of an exemplary semiconductor structure including, from bottom to top, a handle substrate, an insulator layer and a semiconductor material layer that can be employed in accordance with an embodiment of the present disclosure.

The present disclosure will now be described in greater detail by referring to the following discussion and drawings that accompany the present disclosure. It is noted that the drawings of the present disclosure are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present disclosure. However, it will be appreciated by one of ordinary skill in the art that the various embodiments of the present disclosure may be practiced without these specific details. In other instances, well-known structures or processing steps have not been described in detail in order to avoid obscuring the present disclosure.

The present disclosure is now described by way of reference to FIGS. 1-9 which illustrate an exemplary method for fabricating a Fin field-effect transistor (FET). However, the present disclosure is generally applicable to any transistor fabrication process wherein sacrificial gate structures are employed, including planar FETs and nanowire FETs.

Figure 1B:
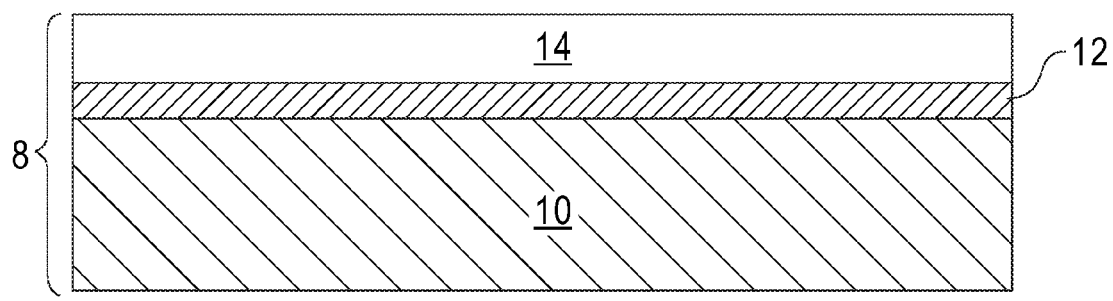
FIG. 1B is a cross sectional view of the exemplary semiconductor structure of FIG. 1A along line B-B'.

Referring first to FIGS. 1A-1B, there are illustrated an exemplary semiconductor structure including a semiconductor substrate 8. In one embodiment of the present disclosure and as shown in FIG. 1B, the semiconductor substrate 8 is a semiconductor-on-insulator (SOI) substrate including, from bottom to top, a handle substrate 10, an insulator layer 12 and a semiconductor material layer 14. In some embodiments of the present disclosure, the handle substrate 10 can be omitted. In another embodiment, a bulk substrate (not shown) can also be used where insulator layer 12 can be omitted.

In some embodiments of the present disclosure, the handle substrate 10 and the semiconductor material layer 14 of the SOI substrate may comprise a same semiconductor material. In other embodiments of the present disclosure, the handle substrate 10 and the semiconductor material layer 14 of the SOI substrate may comprise a different semiconductor material. The term "semiconductor" as used herein in connection with the semiconductor material of the handle substrate 10 and the semiconductor material layer 14 denotes any semiconducting material including, for example, Si, Ge, SiGe, SiC, SiGeC, and III/V compound semiconductors such as, for example, InAs, GaAs, and InP. Multilayers of these semiconductor materials can also be used as the semiconductor material of the handle substrate 10 and the semiconductor material layer 14. In one embodiment, the handle substrate 10 and the semiconductor material layer 14 are both comprised of silicon. In some embodiments, the handle substrate 10 is a non-semiconductor material including, for example, a dielectric material and/or a conductive material.

The handle substrate 10 and the semiconductor material layer 14 may have the same or different crystal orientation. For example, the crystal orientation of the handle substrate 10 and/or the semiconductor material layer 14 may be {100}, {110}, or {111}. Other crystallographic orientations besides those specifically mentioned can also be used in the present disclosure. The handle substrate 10 and/or the semiconductor material layer 14 of the SOI substrate may be a single crystalline semiconductor material, a polycrystalline material, or an amorphous material. Typically, at least the semiconductor material layer 14 is a single crystalline semiconductor material. In some embodiments, the semiconductor material layer 14 that is located atop the insulator layer 12 can be processed to include semiconductor regions having different crystal orientations.

The insulator layer 12 of the SOI substrate may be a crystalline or non-crystalline oxide or nitride. In one embodiment, the insulator layer 12 is an oxide such as, for example, silicon dioxide. The insulator layer 12 may be continuous or it may be discontinuous. When a discontinuous insulator region is present, the insulator region exists as an isolated island that is surrounded by semiconductor material.

The SOI substrate may be formed utilizing standard processes including for example, SIMOX (separation by ion implantation of oxygen) or layer transfer. When a layer transfer process is employed, an optional thinning step may follow the bonding of two semiconductor wafers together. The optional thinning step reduces the thickness of the semiconductor material layer 14 to a layer having a thickness that is more desirable.

The thickness of semiconductor material layer 14 of the SOI substrate is typically from 10 nm to 100 nm, with a thickness from 50 nm to 70 nm being more typical. In some embodiments, and when an ETSOI (extremely thin semiconductor-on-insulator) substrate is employed, the semiconductor material layer 14 of the SOI can have a thickness of less than 10 nm. If the thickness of the semiconductor material layer 14 is not within one of the above mentioned ranges, a thinning step such as, for example, planarization or etching can be used to reduce the thickness of semiconductor material layer 14 to a value within one of the ranges mentioned above. The insulator layer 12 of the SOI substrate typically has a thickness from 1 nm to 200 nm, with a thickness from 100 nm to 150 nm being more typical. The thickness of the handle substrate 10 of the SOI substrate is inconsequential to the present disclosure.

The semiconductor material layer 14 may be doped, undoped or contain doped and undoped regions therein. For clarity, the doped regions are not specifically shown in the drawings of the present disclosure. Each doped region within the semiconductor material layer 14 may have the same, or they may have different conductivities and/or doping concentrations. The doped regions that are present in the semiconductor material layer 14 can be formed by ion implantation process or gas phase doping.

When a bulk semiconductor substrate is employed as semiconductor substrate 8, the bulk semiconductor substrate can be comprised of any semiconductor material including, but not limited to, Si, Ge, SiGe, SiC, SiGeC, and III/V compound semiconductors such as, for example, InAs, GaAs, and InP. Multilayers of these semiconductor materials can also be used as the semiconductor material of the bulk semiconductor. In some embodiments, the semiconductor substrate 8 comprises a single crystalline semiconductor material, such as, for example, single crystalline silicon. In other embodiments, the semiconductor substrate 8 comprises a polycrystalline or amorphous semiconductor material.

In some embodiments of the present disclosure, a layer of hard mask material (not shown) such, as for example, silicon dioxide and/or silicon nitride, can be deposited on the semiconductor material layer 14 prior to forming semiconductor fins. During the subsequent formation of the semiconductor fins, a portion of the hard mask provides a fin cap on a topmost surface of each fin. In such a structure, the gate dielectric material portion to be subsequently formed is present only along the vertical sidewalls of each semiconductor fin. In the embodiment that is illustrated, no fin cap is present and as such, the gate dielectric material portion is present along the vertical sidewalls and on a topmost surface of each semiconductor fin.

Figure 2A:
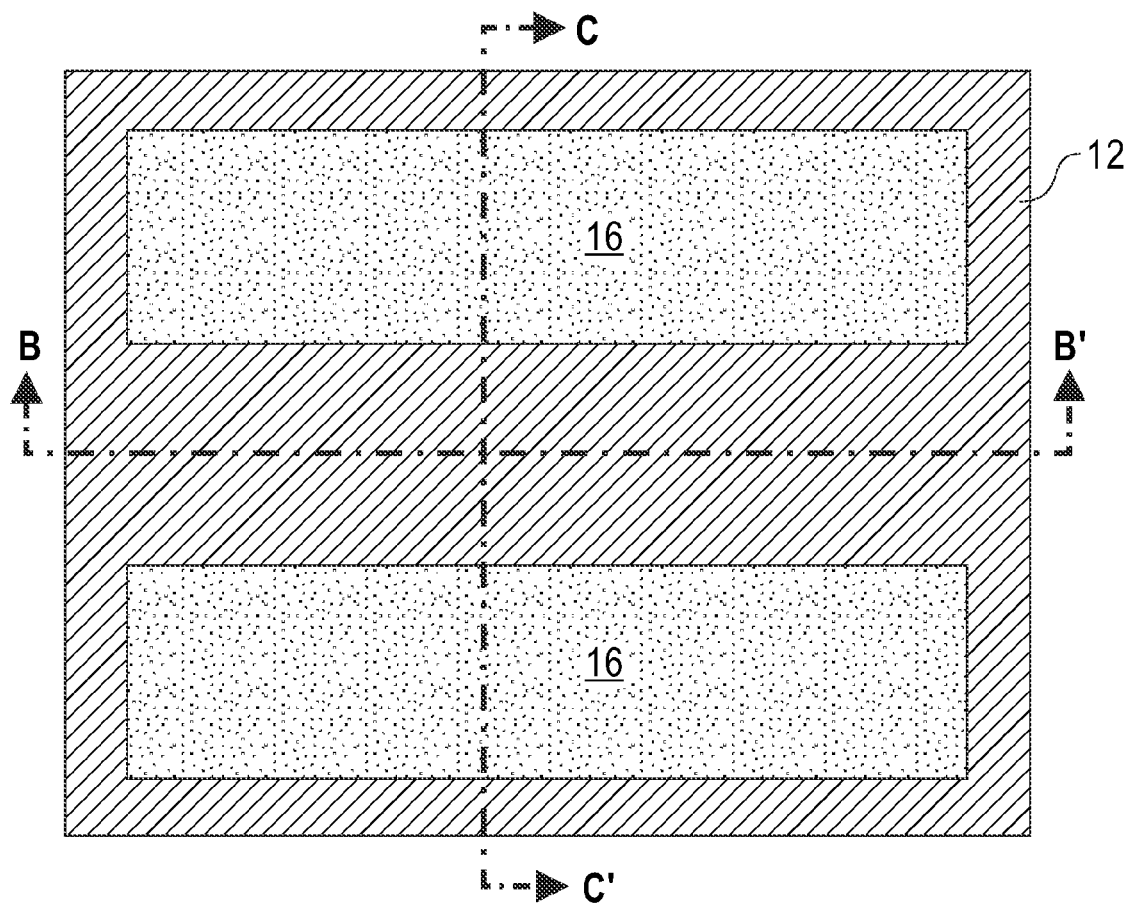
FIG. 2A is a top-down view of the exemplary semiconductor structure of FIG. 1A after forming a plurality of semiconductor fins.
Figure 2B:
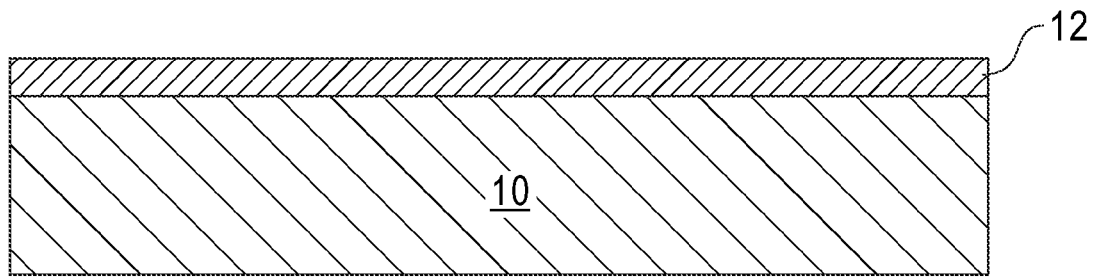
FIG. 2B is a cross sectional view of the exemplary semiconductor structure of FIG. 2A along line B-B'.
Figure 2C:
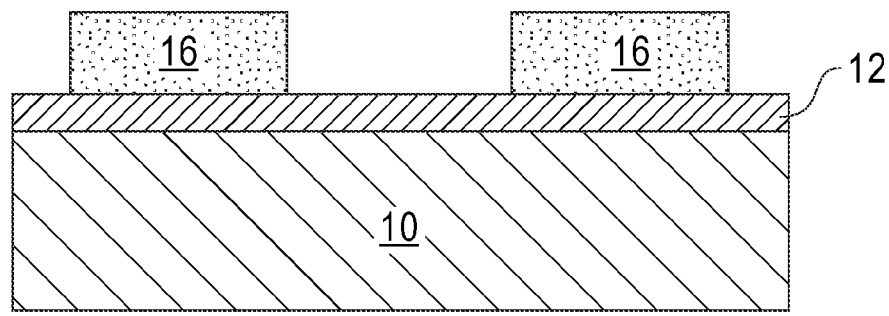
FIG. 2C is a cross sectional view of the exemplary semiconductor structure of FIG. 2A along line C-C'.

Referring now to FIGS. 2A-2C, there are illustrated the exemplary semiconductor structure of FIGS. 1A-1B after forming a plurality of semiconductor fins 16. In the illustrated embodiment of the present disclosure, each semiconductor fin 16 of the plurality of semiconductor fins has a bottommost surface that is located on a surface of the insulator layer 12. Thus, and in the illustrated embodiment, each semiconductor fin 16 is formed on a surface of the SOI substrate that is provided by insulator layer 12. In such an embodiment, an interface is present between the bottommost surface of each semiconductor fin 16 and an upper surface of the insulator layer 12.

In the illustrated embodiment of the present disclosure, each semiconductor fin 16 that is formed comprises a same semiconductor material as that of the semiconductor material layer 14. Each semiconductor fin 16 of the plurality of semiconductor fins is spaced apart from its nearest neighboring semiconductor fin(s) 16. Also, each semiconductor fin 16 of the plurality of semiconductor fins is oriented parallel to each other. While the present disclosure is illustrated with a plurality of semiconductor fins, embodiments in which a single semiconductor fin 16 is employed in lieu of a plurality of semiconductor fins are expressly contemplated herein.

As used herein, a "semiconductor fin" refers to a contiguous structure including a semiconductor material and including a pair of vertical sidewalls that are parallel to each other.

In one embodiment of the present disclosure, each semiconductor fin 16 has a height from 10 nm to 100 nm, and a width from 4 nm to 30 nm. In another embodiment of the present disclosure, each semiconductor fin 16 has a height from 15 nm to 50 nm, and a width from 5 nm to 12 nm.

The semiconductor structure shown in FIGS. 2A-2C can be formed by lithography and etching. Lithography can include forming a photoresist (not shown) on the topmost surface of the semiconductor material layer 14 or on the topmost surface of the layer of hard mask material when the layer of hard mask material is present, exposing the photoresist to a desired pattern of radiation, and then developing the exposed photoresist with a conventional resist developer to provide a patterned photoresist atop the semiconductor material layer 14. At least one etch is then employed which transfers the pattern from the patterned photoresist into the semiconductor material layer 14 utilizing the underlying insulator layer 12 as an etch stop. In one embodiment, the etch used for pattern transfer may include a dry etch process such as, for example, reactive ion etching (RIE), plasma etching, ion beam etching or laser ablation. In another embodiment, the etch used for pattern transfer may include a sidewall image transfer (SIT) process. After transferring the pattern into the semiconductor material layer 14, the patterned photoresist can be removed utilizing a conventional resist stripping process such as, for example, ashing.

Figure 3A:
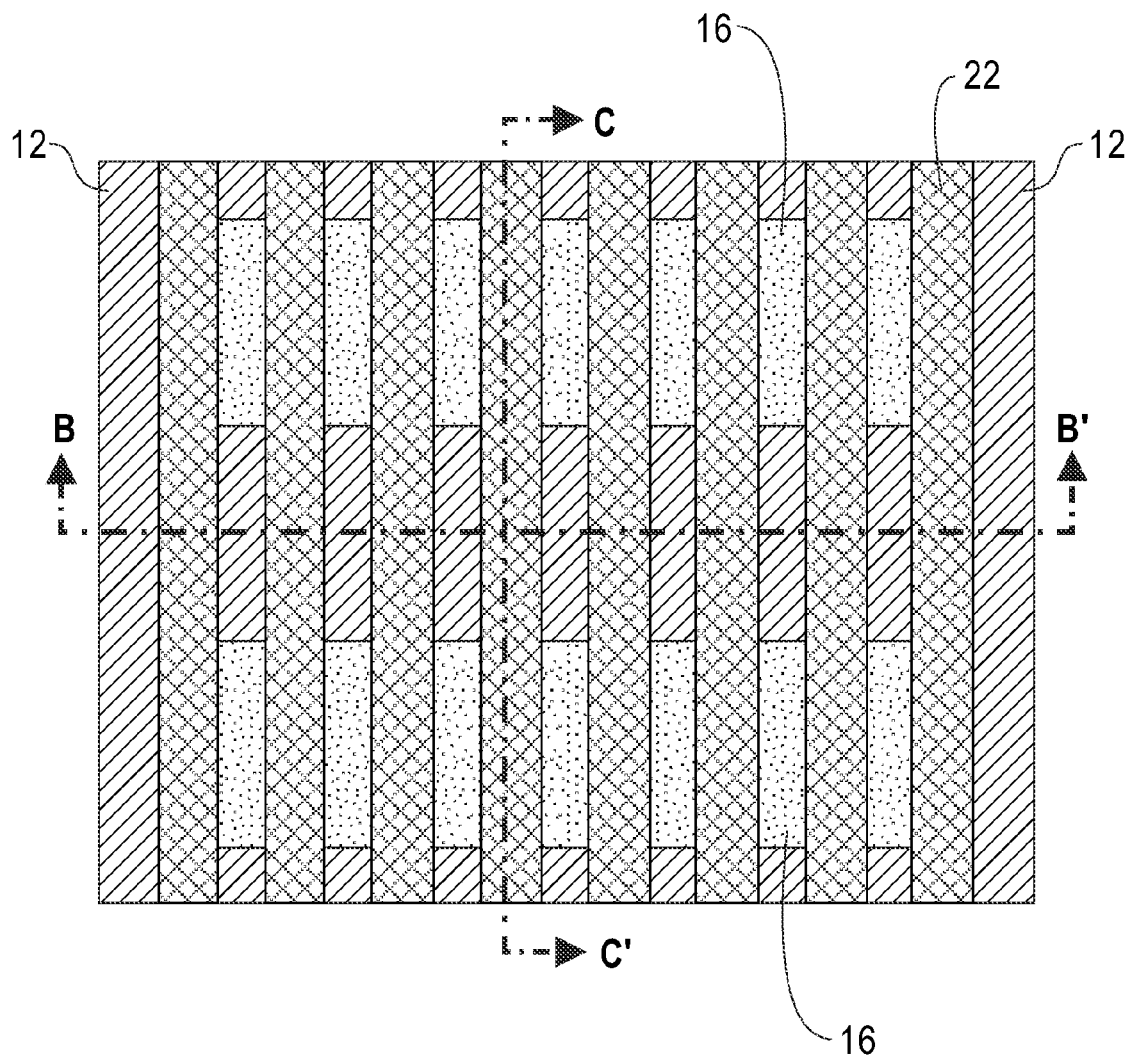
FIG. 3A is a top-down view of the exemplary semiconductor structure of FIG. 2A after forming a plurality of sacrificial gate structures that are orientated perpendicular to and straddle each semiconductor fin.
Figure 3B:
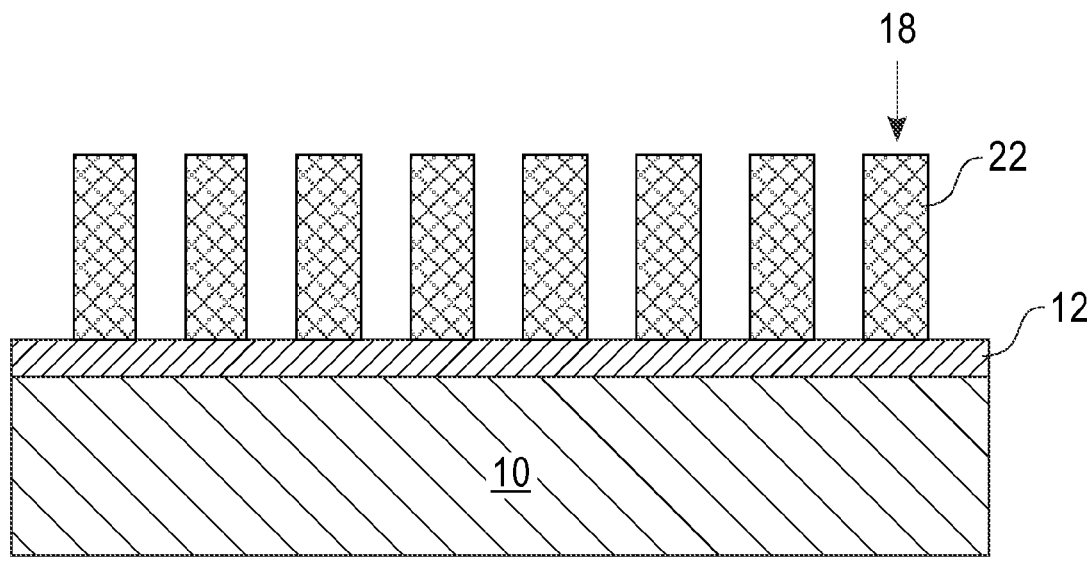
FIG. 3B is a cross sectional view of the exemplary semiconductor structure of FIG. 3A along line B-B'.
Figure 3C:
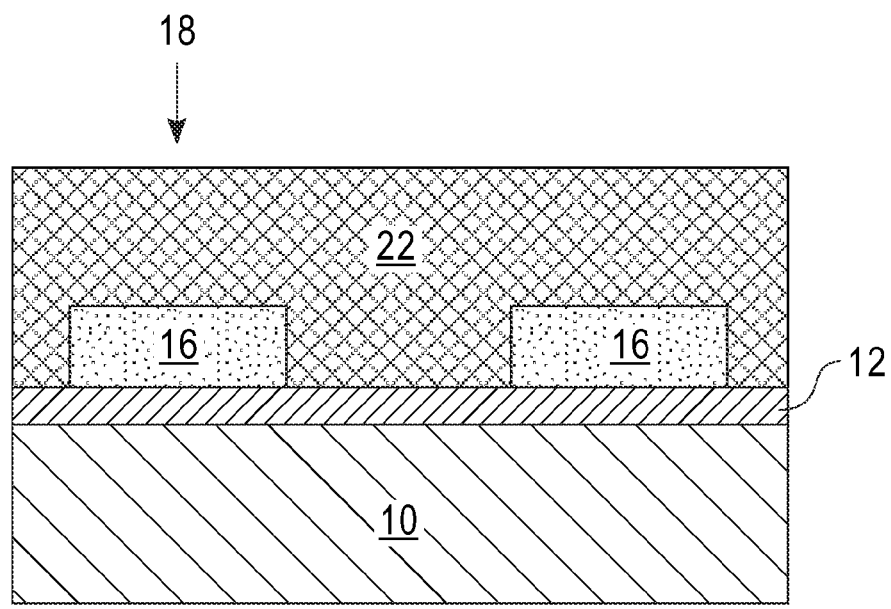
FIG. 3C is a cross sectional view of the exemplary semiconductor structure of FIG. 3A along line C-C'.

Referring now to FIGS. 3A-3C, there are illustrated the exemplary semiconductor structure of FIGS. 2A-2C after forming a plurality of sacrificial gate structures 18 that are oriented perpendicular to and that straddles each semiconductor fin 16. The term "sacrificial gate structure" as used herein refers to a placeholder structure for a functional gate structure to be subsequently formed. The "functional gate structure" as used herein refers to a permanent gate structure used to control output current (i.e., flow of carriers in the channel) of a semiconducting device through electrical or magnetic fields.

The plurality of sacrificial gate structures 18 form a uniform array extending across the SOI substrate. In one embodiment, the sacrificial gate structures 18 are strip-shaped structures uniformly distributed over the SOI substrate. The strip-shaped sacrificial gate structures 18 have substantially uniform pitch and spacing. As used herein, pitch and spacing are "substantially uniform" if values of pitch and spacing vary by less than 10%, preferably less than 5% from the mean values, respectively. Each sacrificial gate structure 18 includes a sacrificial gate material portion 22.

The sacrificial gate structures 18 are formed by first providing a blanket layer of a sacrificial gate material (not shown). The blanket layer of sacrificial gate material can be formed, for example, by chemical vapor deposition (CVD) or plasma enhanced chemical vapor deposition (PECVD). The thickness of the blanket layer of sacrificial gate material can be from 50 nm to 300 nm, although lesser and greater thicknesses can also be employed. The blanket layer of sacrificial gate material can include any material that can be selectively removed from the structure during a subsequently performed etching process. In one embodiment, the blanket layer of sacrificial gate material may be composed of polysilicon. In another embodiment of the present application, the blanket layer of sacrificial gate material may be composed of a metal such as, for example, Al, W, or Cu. After providing the blanket layer of sacrificial gate material, the blanket layer of sacrificial gate material can be patterned by lithography and etching with insulator layer 12 serving as an etch stop so as to form the sacrificial gate structures 18 having substantially uniform pitch and spacing.

At this point of the present disclosure, source and drain regions (not shown) may now be fabricated on each semiconductor fin using any suitable techniques know in the art, including, use of spacer, ion implantation, source/drain recess, epitaxial growth of source/drain materials, activation anneals and/or silicide formation. In some embodiments, the source/drain regions can be formed using top-down deep implants with a doping agent. Suitable doping agents include, but are not limited to, boron, arsenic and phosphorus. The doping agents implanted into the source/drain regions can either be active at this point with a high-temperature rapid thermal anneal or at subsequent point in the fabrication process.

Figure 4A:
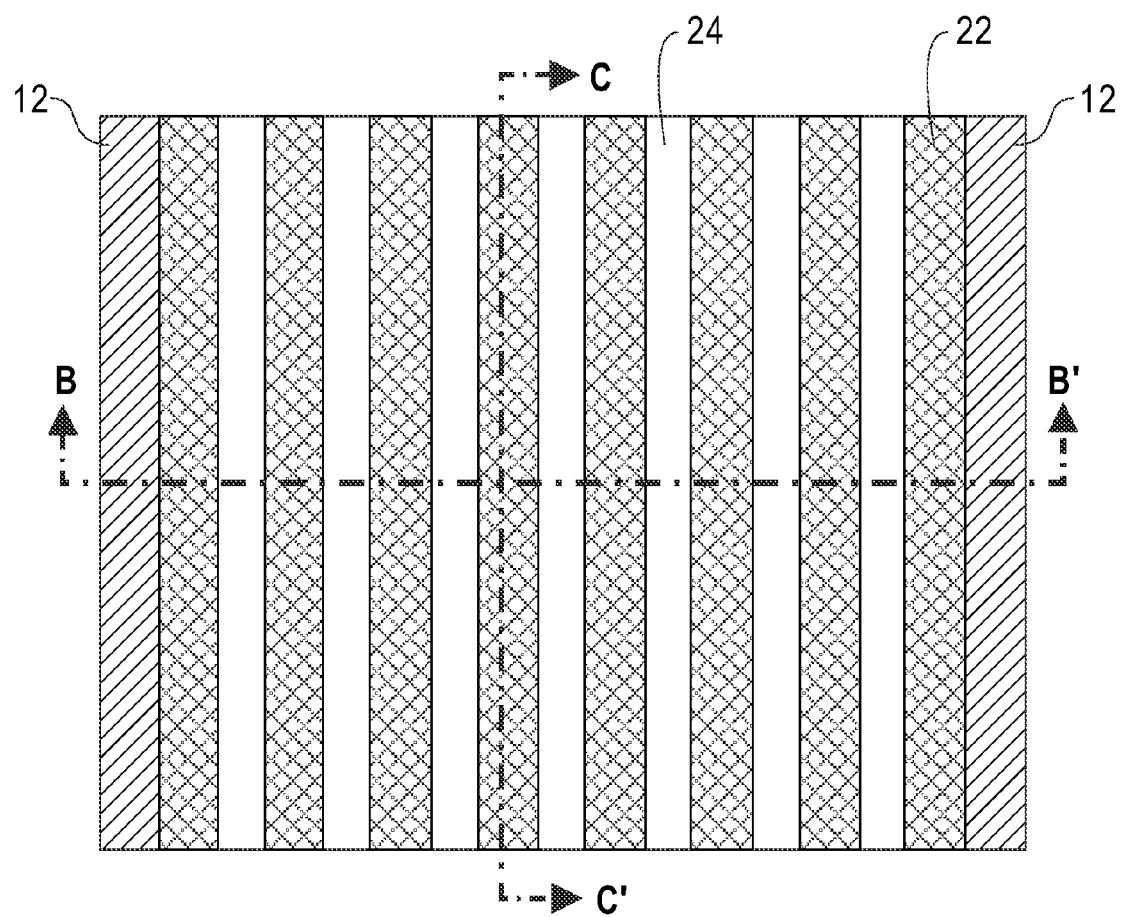
FIG. 4A is a top-down view of the exemplary semiconductor structure of FIG. 3A after forming planarization dielectric material layer portions.
Figure 4B:
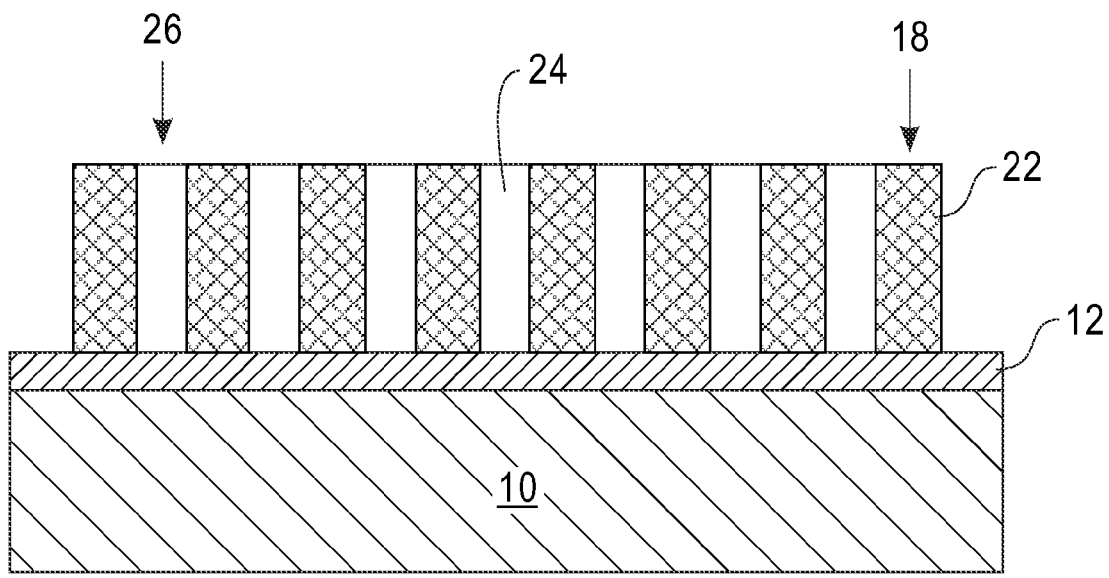
FIG. 4B is a cross sectional view of the exemplary semiconductor structure of FIG. 4A along line B-B'.
Figure 4C:
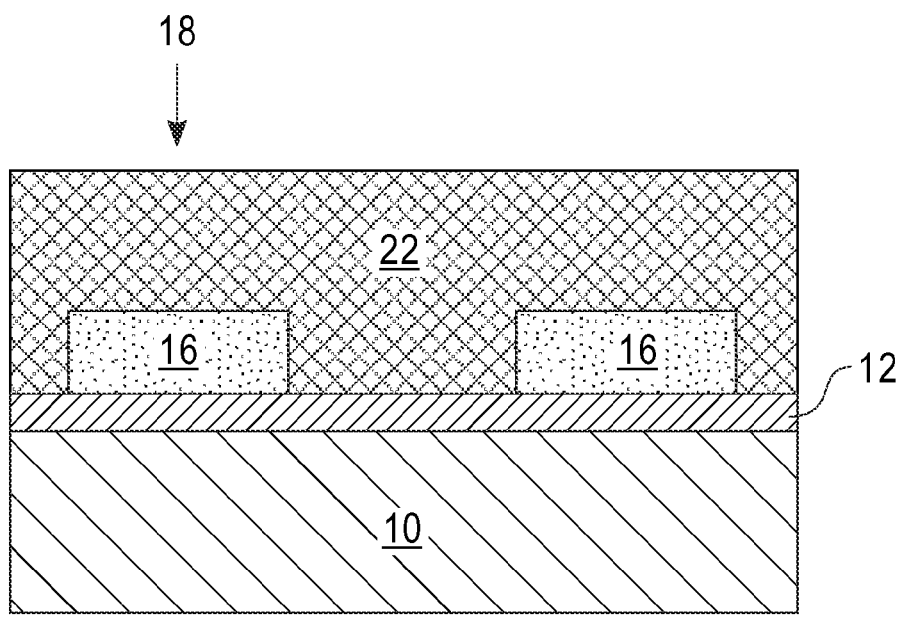
FIG. 4C is a cross sectional view of the exemplary semiconductor structure of FIG. 4A along line C-C'.

Referring now to FIGS. 4A-4C, there are illustrated the exemplary semiconductor structure of FIGS. 3A-3C after forming planarization dielectric material portions 24. The planarization dielectric material portions 24 are formed by first providing a blanket layer of a planarization dielectric material (not shown) onto the SOI substrate, covering the sacrificial gate structures 18 and filling spaces between the sacrificial gate structures 18. The planarization dielectric material is generally a dielectric material that may be easily planarized. For example, the planarization dielectric material can be a doped silicate glass, an undoped silicate glass (silicon oxide), an organosilicate glass (OSG), or a porous dielectric material. In one embodiment, the planarization dielectric material can include a porous or non-porous low dielectric constant (low-k) material having a dielectric constant less than 2.7. The blanket layer of planarization dielectric material can also consist of multiple layers such as silicon nitride, silicon oxide, and spin on glass. The blank layer of planarization dielectric material is subsequently planarized above the topmost surfaces of the sacrificial gate structures 18. The planarization can be performed, for example, by chemical mechanical polishing (CMP). The planar topmost surface of the planarization dielectric material portion 24 is herein referred to as a planar dielectric surface 26. The topmost surfaces of the sacrificial gate structures 18 are coplanar with the planar dielectric surfaces 26 of the planarization dielectric material portions 24 after the planarization. Because of the substantially uniform pitch, spacing and pattern density of the sacrificial gate structures 18, the planarization can be accomplished uniformly across the wafer. As a result, the height of the sacrificial gate structures 18 and the height of planarization dielectric material portions 24 are substantially uniform across the entire SOI substrate. As used herein, height is "substantially uniform" if value of the height varies by less than 10%, preferably less than 5% from the mean height value.

Figure 5A:
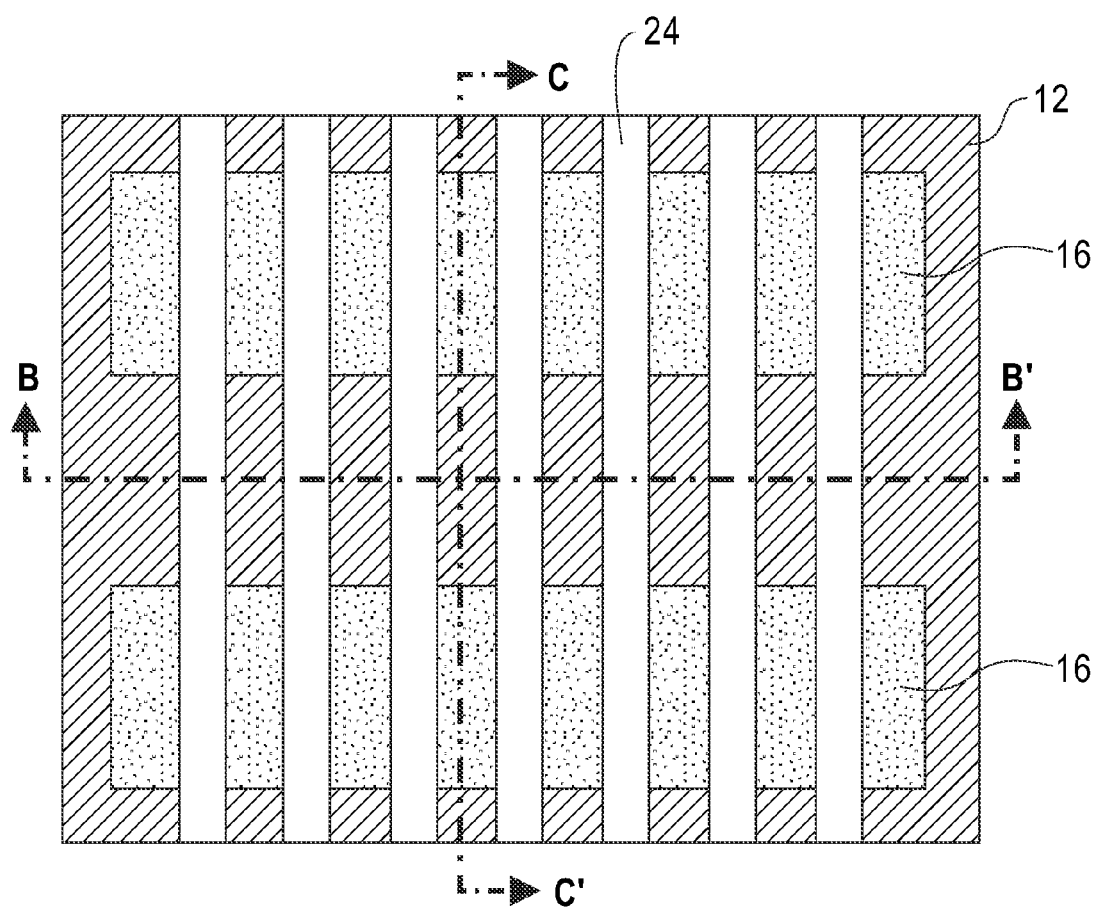
FIG. 5A is a top-down view of the exemplary semiconductor structure of FIG. 4A after removing the sacrificial gate structures.
Figure 5B:
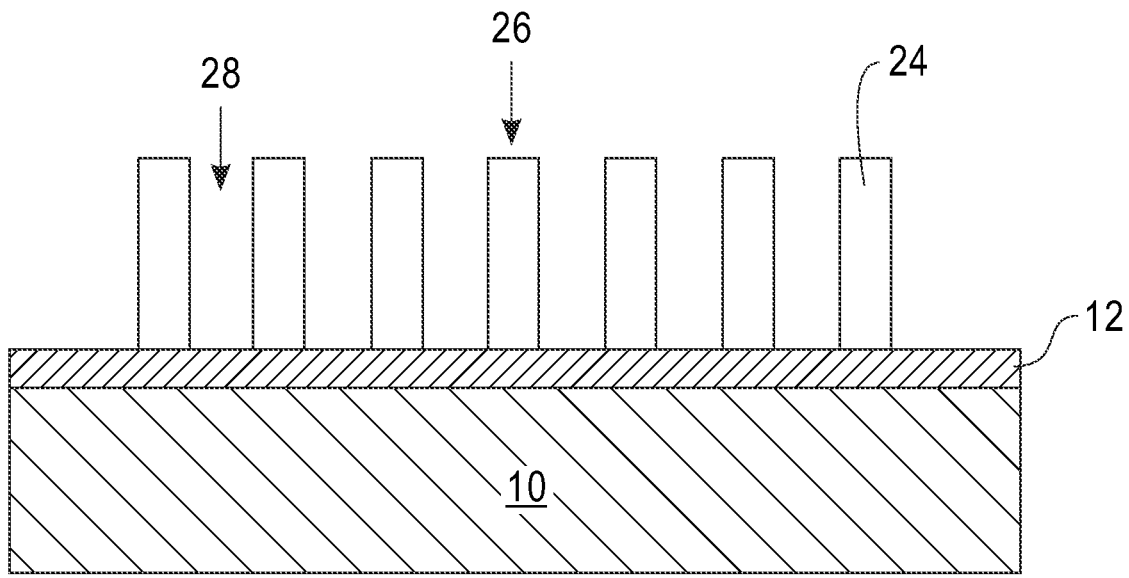
FIG. 5B is a cross sectional view of the exemplary semiconductor structure of FIG. 5A along line B-B'.
Figure 5C:
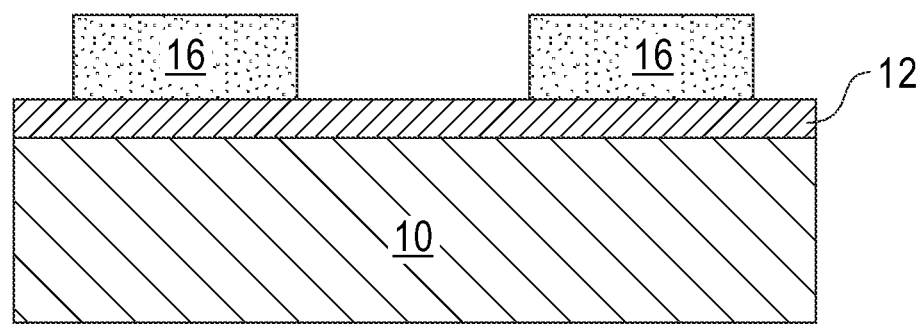
FIG. 5C is a cross sectional view of the exemplary semiconductor structure of FIG. 5A along line C-C'.

Referring now to FIGS. 5A-5C, there are illustrated the exemplary semiconductor structure of FIGS. 4A-4C after removing the sacrificial gate structures 18. The sacrificial gate structures 18 can be removed selective to the planarization dielectric material portions 24 and the semiconductor fins 16 using a wet chemical etch such as an ammonia etch or dry etching such as RIE. The sacrificial gate structures 18 can be etched uniformly across the SOI substrate because of the substantially uniform density, substantially uniform pitch and spacing, of the sacrificial gate structures 18. Recessed regions, which are herein referred to as gate cavities 28, are formed after removal of the sacrificial gate structures 18. Portions of the uppermost surface the insulator layer 12 of the SOI substrate and the top surfaces of the semiconductor fins 16 are exposed within the gate cavities 28. The gate cavities 28 are laterally confined by inner sidewalls of the planarization dielectric material portions 24. In one embodiment, the height of the gate cavities 28 is about 50 nm, and the width of the gate cavities 28 is from 20 to 40 nm.

Figure 6A:
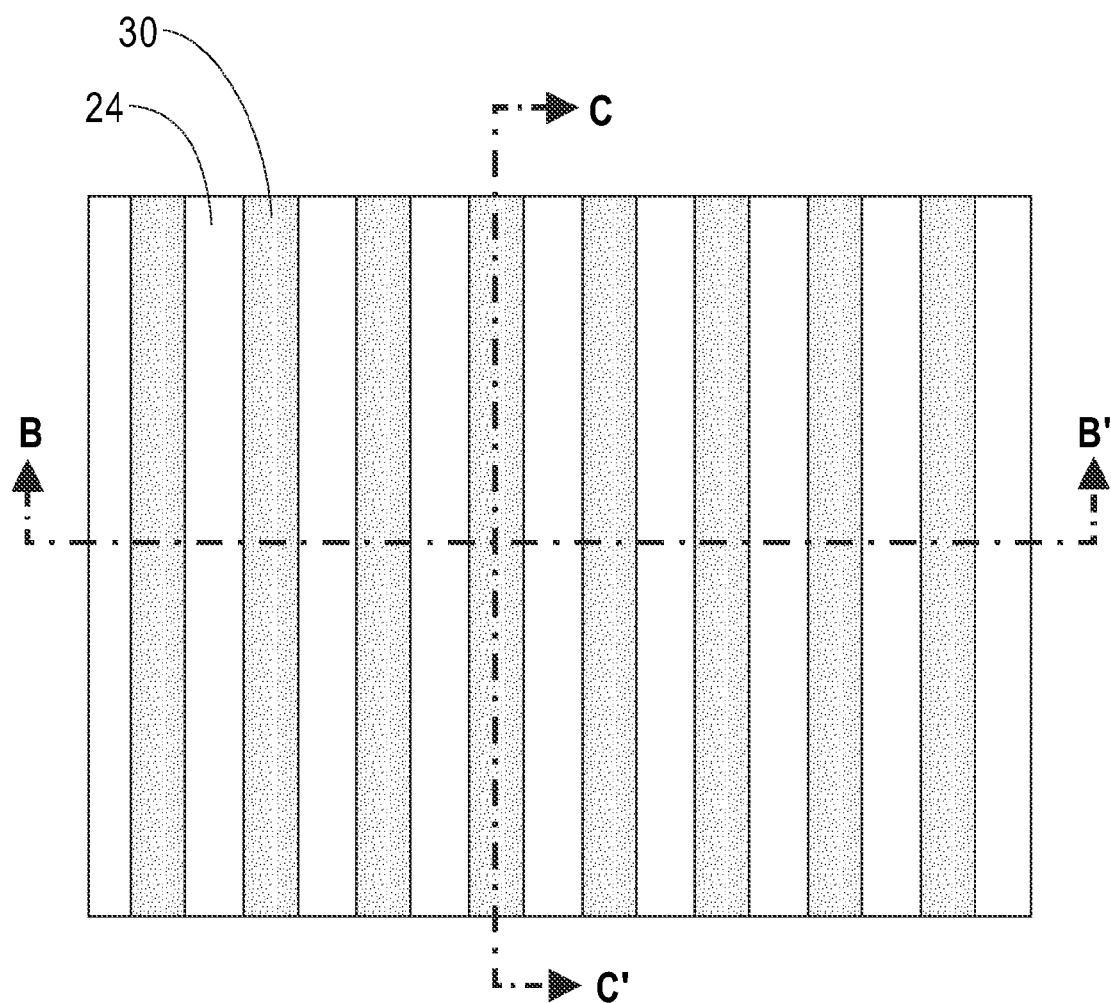
FIG. 6A is a top-down view of the exemplary semiconductor structure of FIG. 6A after forming a plurality of functional gate structures.
Figure 6B:
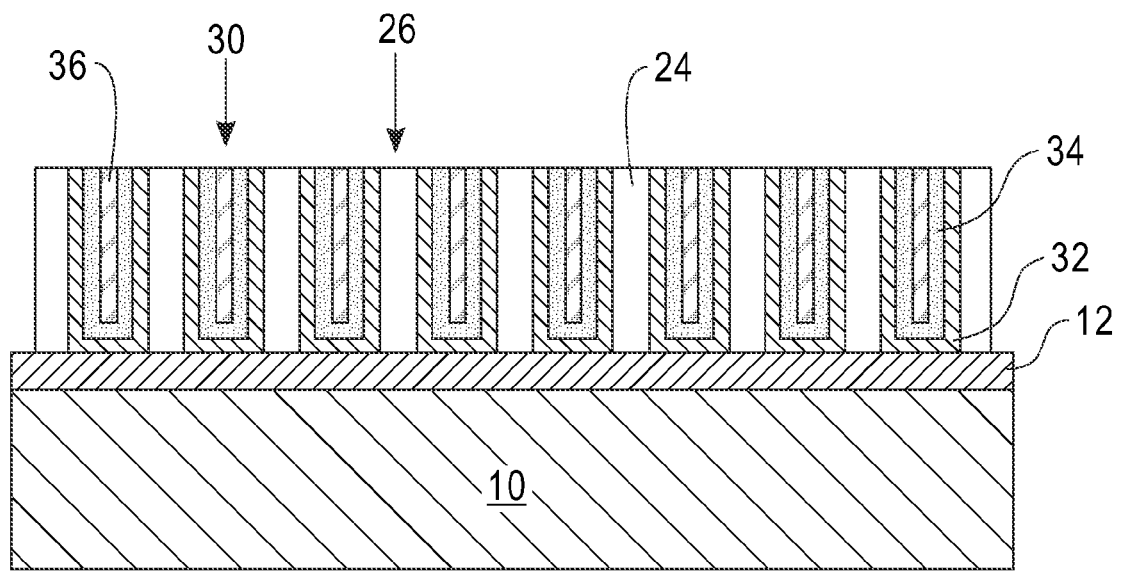
FIG. 6B is a cross sectional view of the exemplary semiconductor structure of FIG. 6A along line B-B'.
Figure 6C:
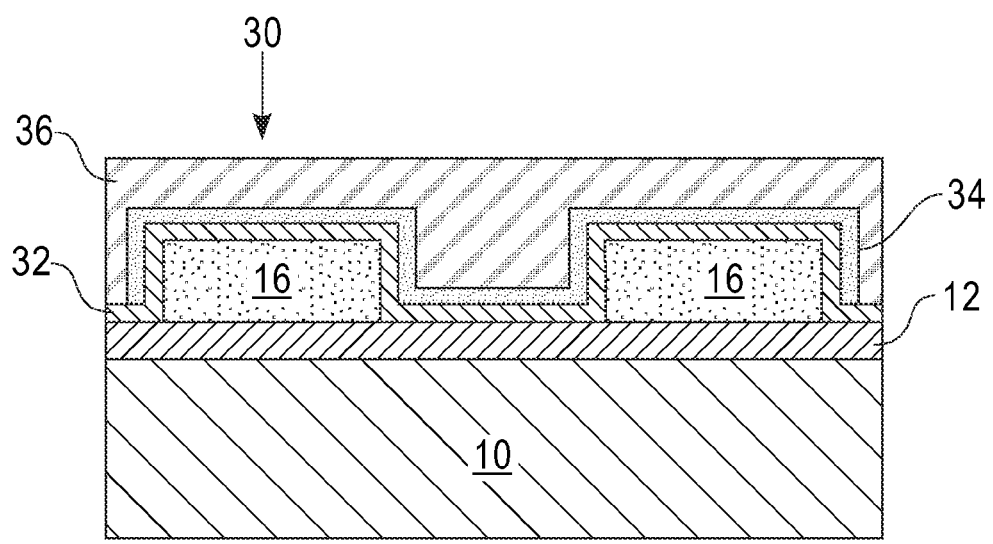
FIG. 6C is a cross sectional view of the exemplary semiconductor structure of FIG. 6A along line C-C'.

Referring to FIGS. 6A-6C, there is illustrated the exemplary semiconductor structure of FIGS. 5A-5C after forming a plurality of functional gate structures 30 in the gate cavities 28. The functional gate structures 30 are uniformly distributed across the SOI substrate. Each functional gate structure 30 includes, from bottom to top, a gate dielectric material portion 32, a work function metal material portion 34 and a conductive material portion 36. The functional gate structures 30 can be formed by providing a material stack of a gate dielectric material, a work function metal material and a conductive material.

The gate dielectric material that provides the gate dielectric material portions 32 of the functional gate structures 30 can be an oxide, nitride, and/or oxynitride. In one example, the gate dielectric material that provides the gate dielectric material portions 32 of the functional gate structures 30 can be a high-k material having a dielectric constant greater than silicon dioxide. Exemplary high-k dielectrics include, but are not limited to, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, SiON, $SiN_x$, a silicate thereof, and an alloy thereof. Each value of x is independently from 0.5 to 3 and each value of y is independently from 0 to 2.

The gate dielectric material used in providing the gate dielectric material portions 32 can be formed by any deposition technique including, for example, CVD, PECVD, physical vapor deposition (PVD), sputtering, or atomic layer deposition. In one embodiment of the present disclosure, the gate dielectric material used in providing the gate dielectric material portion 32 can have a thickness in a range from 1 nm to 10 nm. Other thicknesses that are lesser than or greater than the aforementioned thickness range can also be employed for the gate dielectric material.

The work function metal material used in providing the work function metal material portions 34 can be composed of TiN, TiSiN, TaN, TaSiN, TiTaN, TaRuN, WN, WSiN, or combinations thereof. The work function metal material can be deposited using CVD, sputtering, or plating. The work function metal material used in providing the work function metal material portion 34 typically has a thickness ranging from 1 nm to 10 nm, with a thickness ranging from 2 nm to 5 nm being more typical.

The conductive material used in providing the conductive material portions 36 can be comprised of any conductive metal, including, for example, Al, W, Cu, Pt, Ag, Au, Ru, Ir, Rh and Re, alloys of conductive metals, e.g., Al—Cu, silicides of a conductive metal, e.g., W silicide, and Pt silicide, and combinations thereof. The conductive material used in providing the conductive material portions 36 can be formed utilizing a conventional deposition process such as, for example, atomic layer deposition (ALD), CVD, metalorganic chemical vapor deposition (MOCVD), molecular beam epitaxy (MBE), PVD, sputtering, plating, evaporation, ion beam deposition, electron beam deposition, laser assisted deposition, and chemical solution deposition.

A portion of the material stack of the gate dielectric material, the work function metal material and the conductive material is then removed from above the planar dielectric surfaces 26 by employing a planarization process, for example, CMP. As such and as shown in FIG. 6B, uppermost surfaces of each of the gate dielectric material portions 32, the work function metal material portions 34, and the conductive material portions 36 are coplanar with the planar dielectric surfaces 26 of the planarization dielectric material portions 24 after the planarization.

Because the sacrificial gate structures 18 are formed in a uniform array extending across the wafer, planarization dielectric material portions 24 subsequently formed between spaces of sacrificial gate structures 18 also have uniform pitch and spacing. As a result, the planarization of the material stack of the gate dielectric material, the work function metal material and the conductive material can be accomplished uniformly across the SOI substrate. The functional gate structures 30 that are formed have a substantially uniform height across the entire SOI substrate.

Figure 7A:
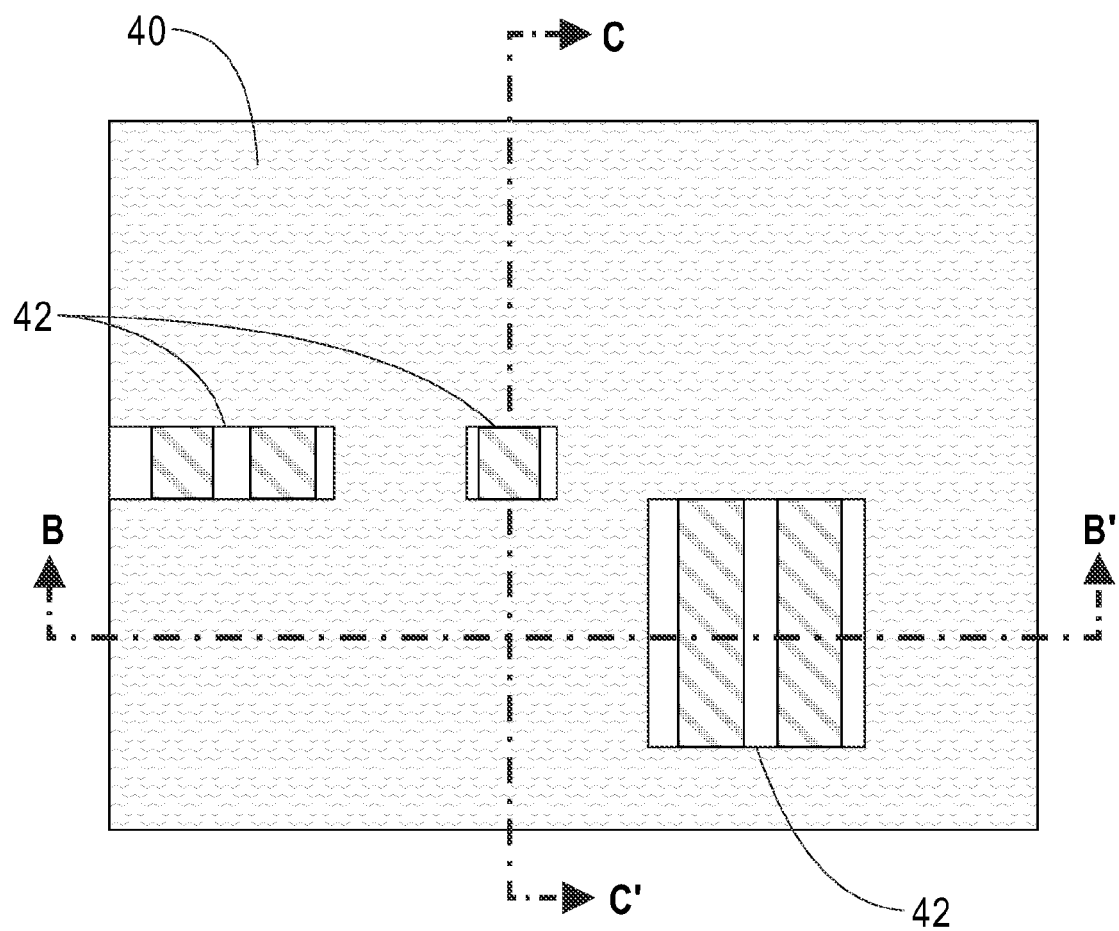
FIG. 7A is a top-down view of the exemplary semiconductor structure of FIG. 6A after forming openings in a photoresist layer.
Figure 7B:
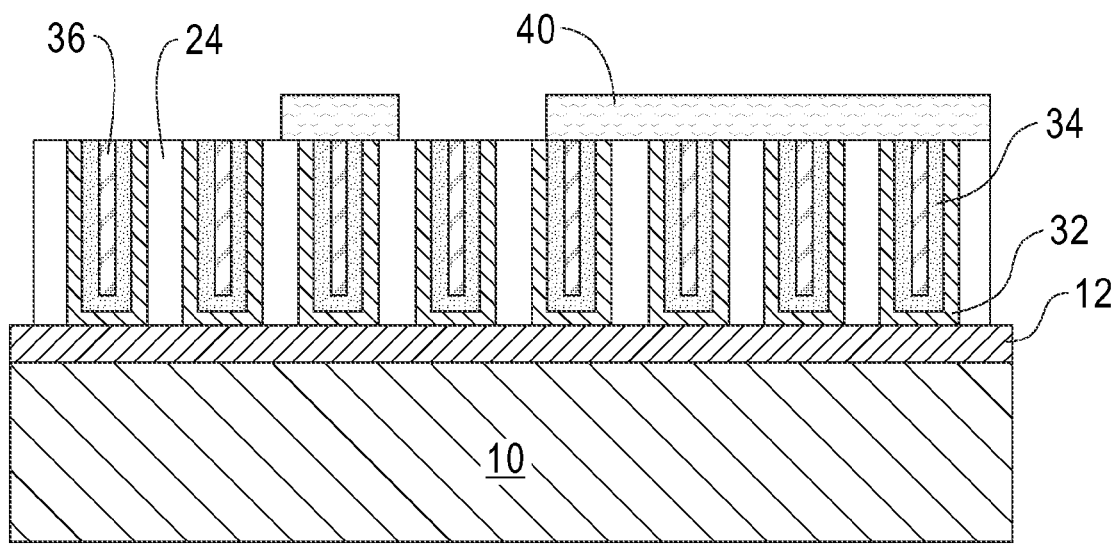
FIG. 7B is a cross sectional view of the exemplary semiconductor structure of FIG. 7A along line B-B'.
Figure 7C:
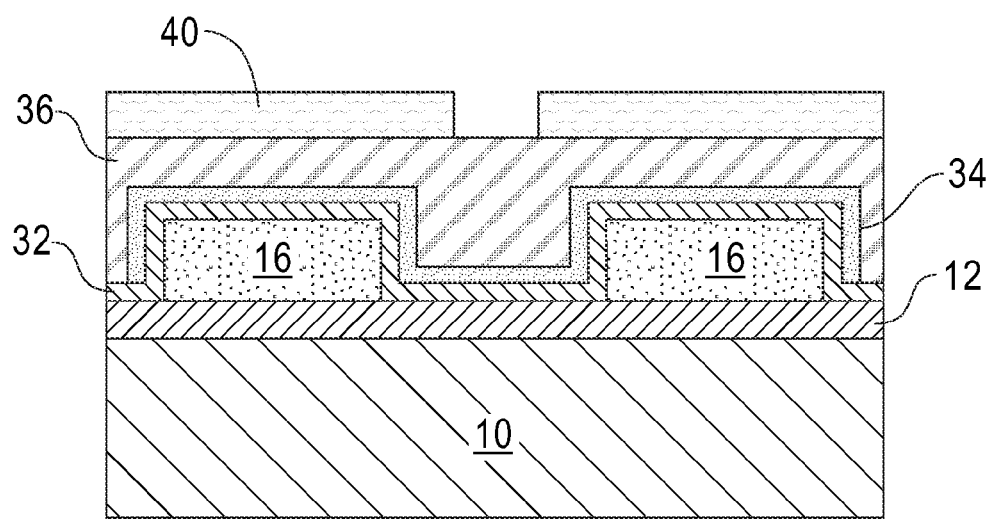
FIG. 7C is a cross sectional view of the exemplary semiconductor structure of FIG. 7A along line C-C'.

Referring now to FIGS. 7A-7C, there are illustrated the exemplary semiconductor structure of FIGS. 6A-6C after forming openings 42 in a photoresist layer 40. The photoresist layer 40 is employed to remove unwanted portions of the functional gate structures 30 according to a circuit design. The photoresist layer 40 is first deposited onto the SOI substrate, covering the functional gate structures 30 and the planarization dielectric material layer portions 24. Patterning of the photoresist layer 40 is achieved using lithography. In one embodiment of the present disclosure, the photoresist layer 40 is exposed to a desired pattern of radiation. After using a conventional resistor developer to develop the exposed portions of the photoresist layer 40, openings 42 are selectively formed in the photoresist layer 40, exposing portions of functional gate structures 30 that will be removed subsequently. The particular circuit design determines which portions of functional gate structures 30 are removed and which are kept.

Figure 8A:
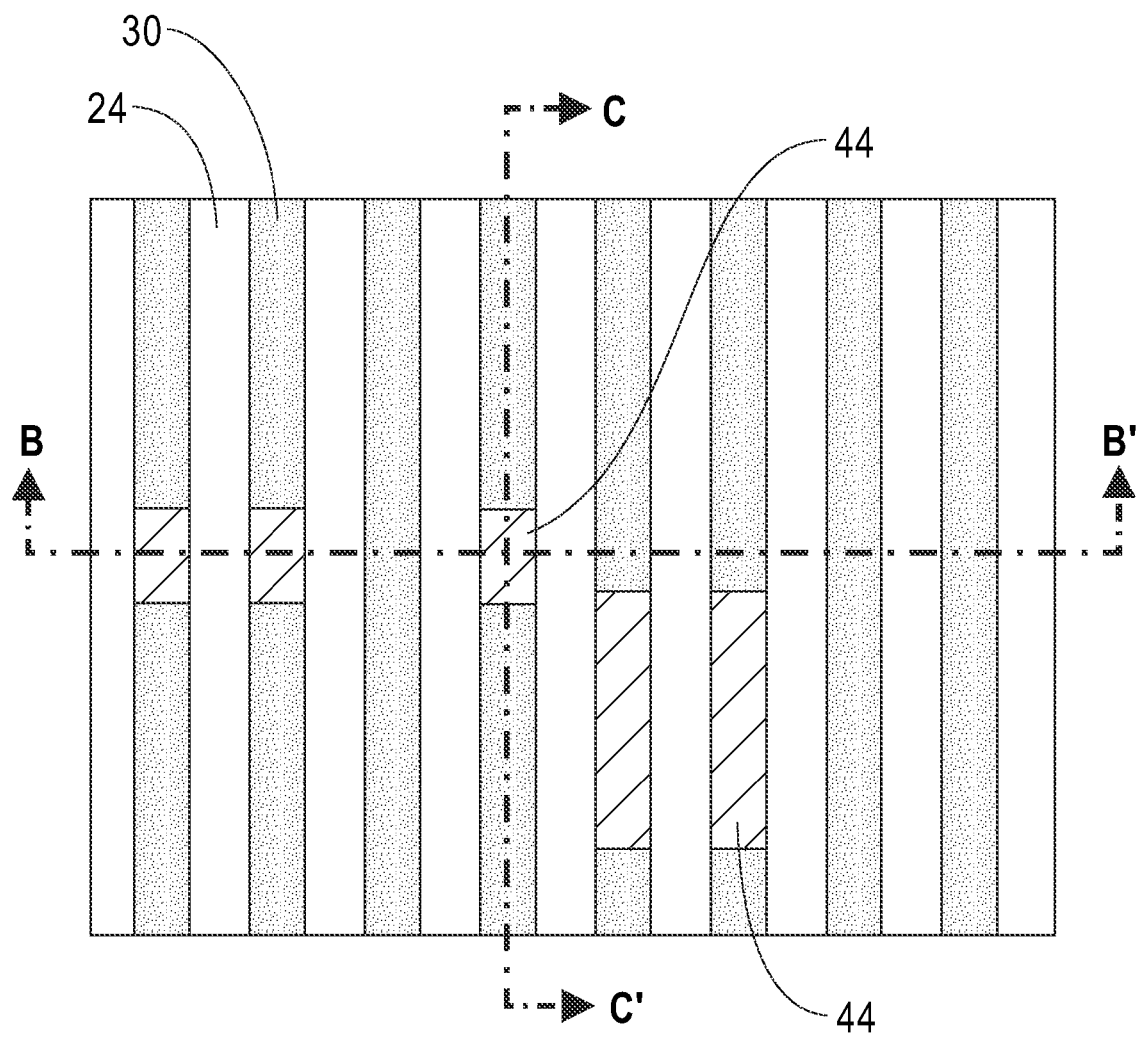
FIG. 8A is a top-down view of the exemplary semiconductor structure of FIG. 7A after removing exposed portions of functional gate structures to provide openings.
Figure 8B:
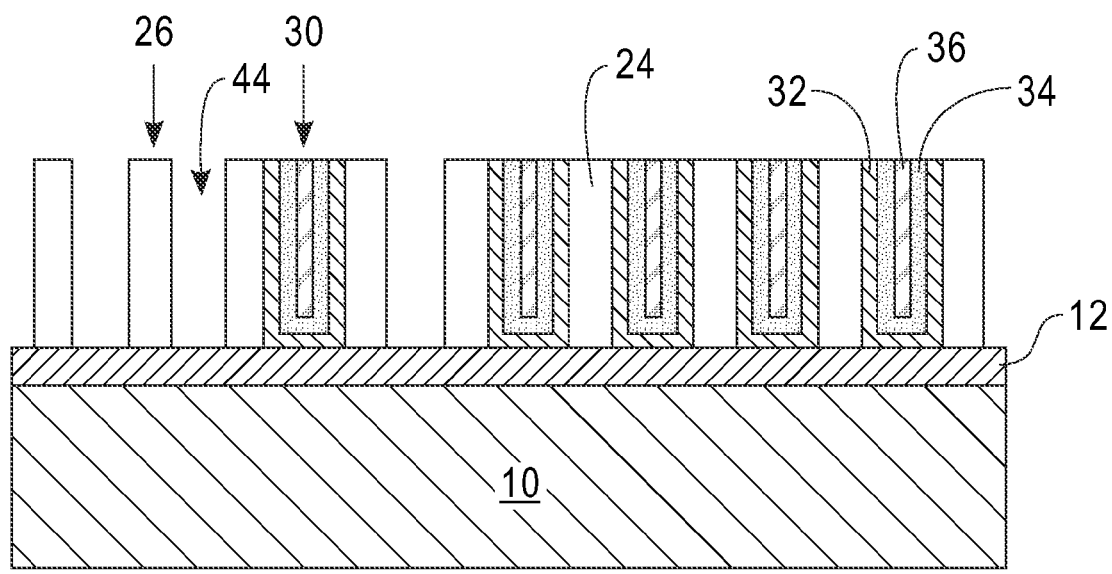
FIG. 8B is a cross sectional view of the exemplary semiconductor structure of FIG. 8A along line B-B'.
Figure 8C:
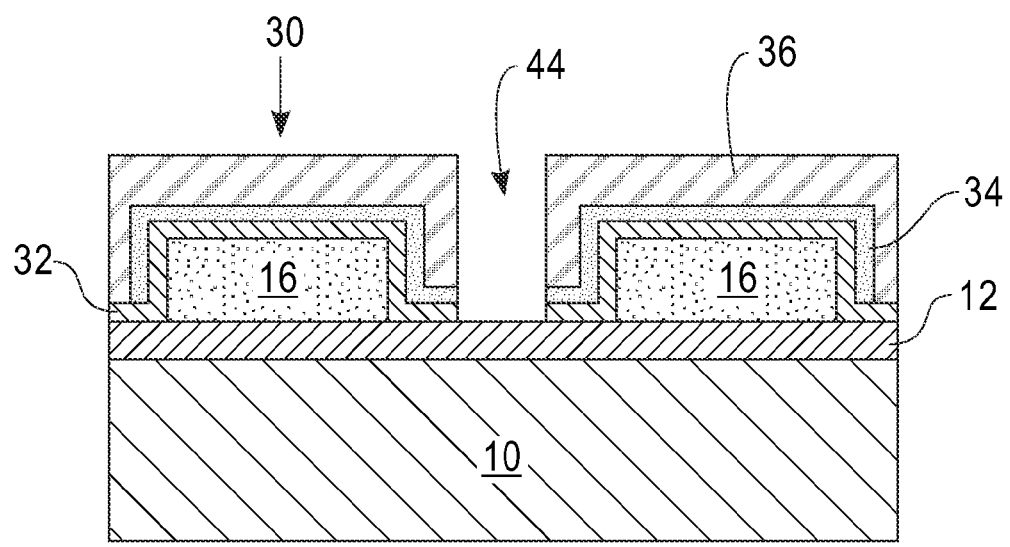
FIG. 8C is a cross sectional view of the exemplary semiconductor structure of FIG. 8A along line C-C'.

Referring now to FIGS. 8A-8C, there are illustrated the exemplary semiconductor structure of FIGS. 7A-7C after removing exposed portions of functional gate structures 30. The exposed portions of functional gate structures 30 can be removed selective to the planarization dielectric material portions 24 using wet chemical etching and/or dry etching. In some embodiments of the present disclosure, a RIE process can be performed to etch away the conductive material portions 36 down to the work function metal portions 34. This is followed by a wet etch to further remove the work function metal material portions 34 and the gate dielectric material portions 32 to form openings 44. The wet etch may include an aqueous solution of HCl, HF or other wet etchants as needed. The openings 44 re-expose portions the uppermost surface of the insulation layer 12 of SOI substrate. After removing the exposed portions of the functional gate structures 30, the photoresist layer 40 can be removed utilizing a conventional resist stripping process such as, for example, ashing.

Figure 9A:
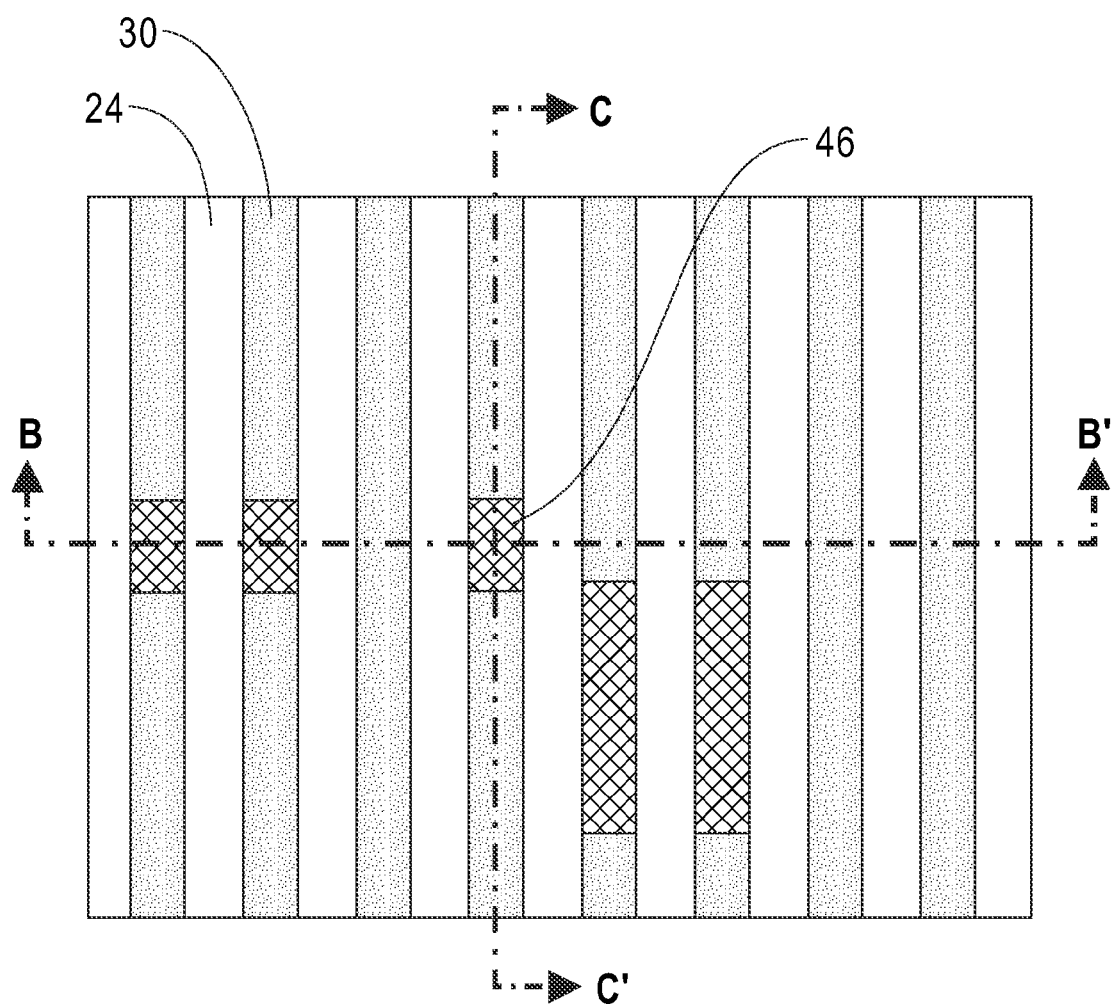
FIG. 9A is a top-down view of the exemplary semiconductor structure of FIG. 8A after filling the openings with an interlayer dielectric material.
Figure 9B:
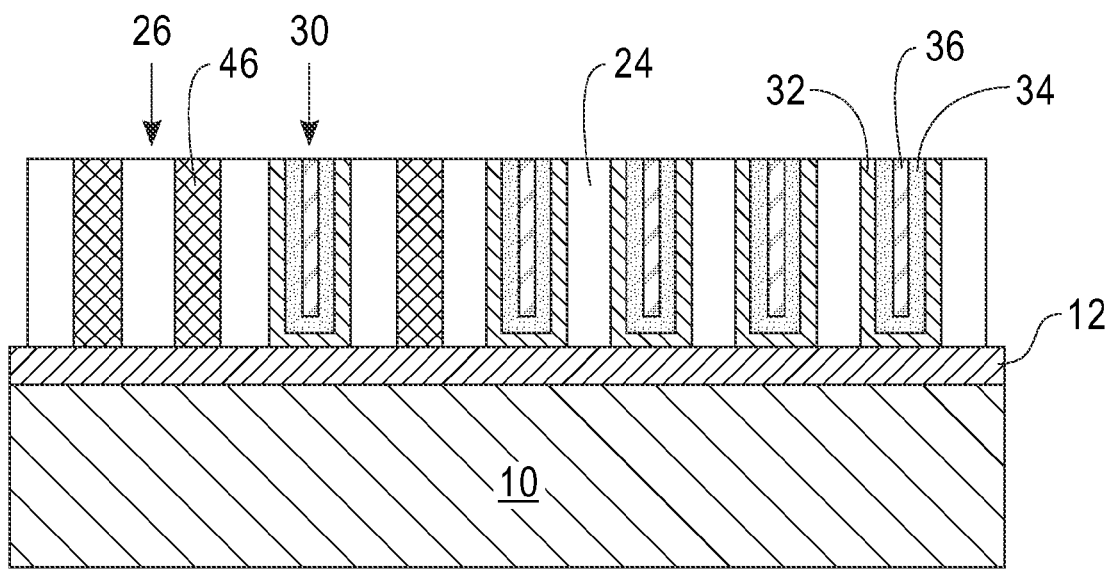
FIG. 9B is a cross sectional view of the exemplary semiconductor structure of FIG. 9A along line B-B'.
Figure 9C:
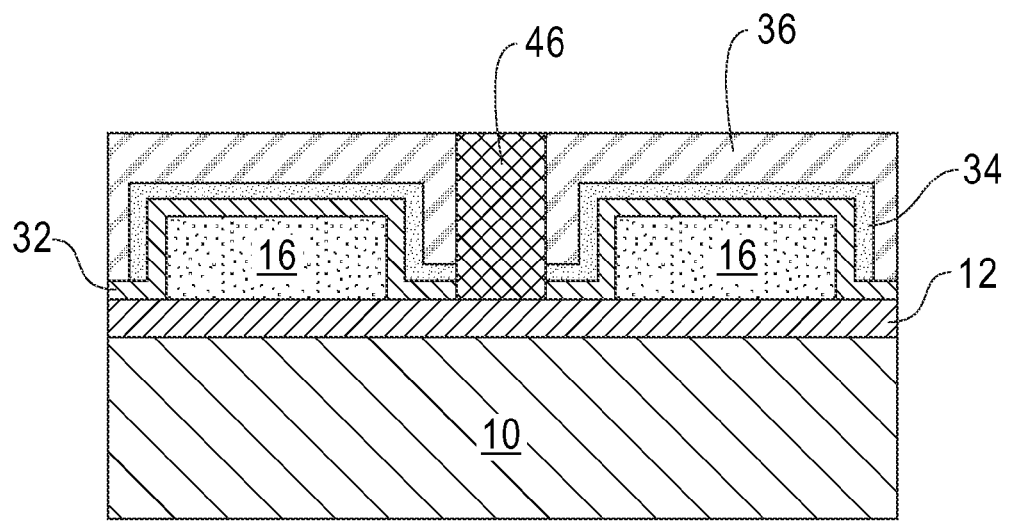
FIG. 9C is a cross sectional view of the exemplary semiconductor structure of FIG. 9A along line C-C'.

Referring now to FIGS. 9A-9C, there are illustrated the exemplary semiconductor structure of FIGS. 8A-8C after filling openings 44 with interlayer dielectric material layer portions 46. The interlayer dielectric material layer portions 46 may be composed of a nitride, such as, for example, silicon nitride. The interlayer dielectric material layer portions 46 can be formed by depositing a blanket layer of a dielectric material (not shown) using an ALD process or other processes capable of filling openings. The interlayer dielectric material layer is then planarized with CMP to recess the top of the interlayer dielectric material layer to approximately the same height as the top of planarization dielectric material layer portions and the functional gate structures 30. The remaining portions of the interlayer dielectric material layer are herein referred to as interlayer dielectric material layer portions 46.

While the present disclosure has been particularly shown and described with respect to various embodiments thereof, it will be understood by those skilled in the art that the foregoing and other changes in forms and details may be made without departing from the spirit and scope of the present disclosure. It is therefore intended that the present disclosure not be limited to the exact forms and details described and illustrated, but fall within the scope of the appended claims.

What is claimed is:

1. A method of forming a semiconductor structure comprising:
    forming an array of functional gate structures of substantially uniform pitch and spacing over a semiconductor substrate, wherein the functional gate structures are of a substantially uniform height, and wherein the functional gate structures are separated from each other by first dielectric material layer portions;
    removing portions of the functional gate structures according to a circuit design to form openings in the functional gate structures, wherein the openings extend through the functional gate structures to expose a top surface of the semiconductor substrate; and
    forming second dielectric material layer portions in the openings.

2. The method of claim 1, wherein the removed portions of the functional gate structures are extraneous features in the circuit design.

3. The method of claim 1, wherein the semiconductor substrate is a bulk semiconductor substrate or a semiconductor-on-insulator (SOI) substrate.

4. The method of claim 1, wherein each of the functional gate structures comprises a gate dielectric material portion, a work function metal material portion, and a conductive material portion.

5. The method of claim 4, wherein the gate dielectric material portion comprises $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, SiON, $SiN_x$, a silicate thereof, or an alloy thereof.

6. The method of claim 4, wherein the work function metal material portion comprises TiN, TiSiN, TaN, TaSiN, TiTaN, TaRuN, WN, WSiN, or combinations thereof.

7. The method of claim 4, wherein the conductive material portion comprises Al, W, Cu, Pt, Ag, Au, Ru, Ir, Rh, Re, alloys thereof, or silicides thereof.

8. The method of claim 1, wherein the first dielectric material layer portions comprises silicon oxide.

9. The method of claim 1, wherein the second dielectric material layer portions comprises silicon nitride.

10. The method of claim 1, wherein the forming of said array of functional gate structures of said substantially uniform pitch and spacing over said semiconductor substrate comprises:
    forming an array of sacrificial gate structures of substantially uniform pitch and spacing over the semiconductor substrate;
    forming a first dielectric material layer over the sacrificial gate structures, the first dielectric material layer filling spaces between the sacrificial gate structures;
    performing a chemical mechanical polishing (CMP) process on the first dielectric material layer to expose the sacrificial gate structures and to provide the first dielectric material layer portions filling spaces between the sacrificial gate structures;
    removing the sacrificial gate structures to reveal gate cavities; and
    forming the functional gate structures in the gate cavities.

11. The method of claim 10, wherein the forming of said array of functional gate structures of said substantially uniform pitch and spacing over said semiconductor substrate further comprises:
    depositing blanket layers of a material stack of a gate dielectric material, a work function metal material, and a conductive material over the first dielectric material portions and in the gate cavities; and
    performing another CMP process to remove the gate dielectric material, the work function metal material, and the conductive material outside of the gate cavities and to provide a gate dielectric material portion, a work function metal material portion, and a conductive material portion in each gate cavity.

12. The method of claim 1, wherein the forming of said array of sacrificial gate structures of substantially uniform pitch and spacing over said semiconductor substrate comprises:
    depositing a blanket layer of a disposable gate material layer; and
    patterning the blanket layer of the disposable gate material layer to form the sacrificial gate structures of substantially uniform pitch and spacing.

13. The method of claim 12 further comprising forming a plurality of semiconductor fins prior to the depositing the blanket layer of a disposable gate material layer.

14. The method of claim 1, wherein the forming second dielectric material layer portions in the removed portions of the functional gate structures comprises:
    forming a second dielectric material layer over the functional gate structures and the first dielectric material layer portions, the second dielectric material layer filling the removed portions of the functional gate structures; and
    recessing the second dielectric material layer to expose the functional gate structures and the first dielectric material layer portions by CMP or etching.

15. A method of forming a semiconductor structure comprising:
    forming an array of functional gate structures of substantially uniform pitch and spacing over a semiconductor substrate, wherein the functional gate structures are of a substantially uniform height, and wherein the functional gate structures are separated from each other by first dielectric material layer portions;
    removing portions of the functional gate structures according to a circuit design, wherein the removing portions of the functional gate structures according to said circuit design comprises:
        forming a photoresist layer overlying the functional gate structures and the first dielectric material layer portions;
        forming openings in the photoresist layer, the openings exposing portions of the functional gate structures that represent extraneous features in the circuit design; and
        removing the exposed portions of the functional gate structures; and
    forming second dielectric material layer portions in the removed portions of the functional gate structures.

16. A semiconductor structure comprising:
    first dielectric material layer portions arranged in a uniform array and extending in a first direction across a semiconductor substrate;
    a plurality of functional gate structures disposed in portions of spaces between the first dielectric material layer portions, the functional gate structures having a substantially uniform height; and
    second dielectric material layer portions disposed in remaining portions of the spaces between the first dielectric material layer portions,
    wherein the plurality of functional gate structures are separated from each other by the first dielectric material layer portions in the first direction, and
    wherein ends of portions of the plurality of functional gate structures are separated from each other by the second dielectric material layer portions in a second direction perpendicular to the first direction, the second dielectric material layer portions having a same width as the adjoined portions of the plurality of functional gate structures.

17. The semiconductor structure of claim 16, wherein the semiconductor substrate is a bulk semiconductor substrate or a semiconductor-on-insulator (SOI) substrate.

18. The semiconductor structure of claim 16, wherein the first dielectric material layer portions comprises silicon oxide.

19. The semiconductor structure of claim 16, wherein the second dielectric material layer portions comprises silicon nitride.

20. The semiconductor structure of claim 16, wherein each of the plurality of functional gate structures comprises a gate dielectric material portion, a work function metal material portion, and a conductive material portion.

* * * * *